(12) United States Patent
Grant et al.

(10) Patent No.: US 6,278,199 B1
(45) Date of Patent: Aug. 21, 2001

(54) ELECTRONIC SINGLE SWITCH MODULE

(75) Inventors: William Grant, Fountain Valley; Joshua Polack, Glendale, both of CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/512,483

(22) Filed: Feb. 23, 2000

Related U.S. Application Data (60) Provisional application No. 60/121,622, filed on Feb. 25, 1999.

(51) Int. Cl.[7] ........................................... B60L 1/00
(52) U.S. Cl. ............................ 307/10.1; 307/131
(58) Field of Search ........................ 307/10.1, 10.6, 307/29, 131; 257/787, 788, 723, 724, 712, 713, 730, 731, 697, 698, 693, 668, 707

(56) References Cited

U.S. PATENT DOCUMENTS

| | | | |
|---|---|---|---|
| 5,297,001 | * | 3/1994 | Sterling .................................. 361/717 |
| 5,563,447 | * | 10/1996 | Lake et al. ............................. 257/724 |
| 5,821,618 | * | 10/1998 | Graf et al. ............................. 257/723 |
| 6,166,464 | * | 12/2000 | Grant ....................................... 310/68 |

* cited by examiner

Primary Examiner—Stephen W. Jackson
Assistant Examiner—Sharon Polk
(74) Attorney, Agent, or Firm—Ostrolenk, Faber, Gerb & Soffen, LL (57) ABSTRACT

An electronic module is provided using one or more field effect transistors (FETs) arranged on a conductive plate such that the module is capable of switching very high currents while remaining compact and still providing excellent thermal management properties. A plurality of conductive plates are bonded with an insulating material, the insulating material also forms a housing. One or more FETs are arranged inside the housing on one of the plates such that an electrical connection is made between a first region of the FET and the plate. A second FET region is electrically connected to another conductive plate. A circuit board is contained within the housing in which an electrical connection is made between the second region and the circuit board, and between a third FET region and the circuit board.

25 Claims, 6 Drawing Sheets

SECTION 5-5

FIG. 5

SECTION 6-6

SECTION 12-12

ELECTRONIC SINGLE SWITCH MODULE

CROSS-REFERENCE TO RELATED APPLICATION

This application is related to U.S. Provisional Application Ser. No. 60/121,622 filed Feb. 25, 1999, entitled ELECTRONIC SINGLE SWITCH MODULE, the entirety of which is incorporated herein by reference.

BACKGROUND OF THE INVENTION

The present invention relates to a semiconductor module, specifically a compact switch module that exhibits good thermal energy dissipation characteristics and is capable of carrying a very large current.

High power applications require that the circuits delivering these currents be capable of carrying very large amounts of current. Certain applications demand current capabilities in excess of 1000 Amperes. A device typically found in such circuits is a switch. For example, the electronic control circuitry for an automotive turbocharger, supercharger, or super-turbocharger requires switching these extremely large currents. Circuit switches are generally available as either mechanical switches or electronic switches. Mechanical switches typically employ a number of metallic contact points which are connected or disconnected by physically moving, either manually or automatically, a conductor between the contact points. Mechanical switches wear out and are prone to breakage.

Electronic switches typically employ transistors, which can be switched on and off by applying a base current or a gate voltage, depending on the type of transistor. Power metal oxide field effect transistors (MOSFETs) and insulated gate bipolar transistors (IGETs) (hereinafter FETs) are used as switching transistors because, among their other useful characteristics, they are easily paralleled and are able to carry large currents. However, because of their resistive characteristics, FET based switches are prone to heating. This becomes problematic when switching high current loads. In addition, high current switching applications employ the use of multiple FETs, whose respective gates, drains and sources are connected in parallel. These parallel configurations require large modules to house the FETs. The modules also require large heatsinks to dissipate the heat, further increasing overall package size.

It is desirable to have a FET based switch module which can reliably switch a large current, is small, exhibits good thermal management properties and can be arranged to have low inductance.

SUMMARY OF THE INVENTION

It is an object of the present invention to provide a field effect transistor (FET) single switch module housing at least one FET, and preferably a plurality of parallel FETS, in die form such that the module is compact, rugged, and is capable of switching a very large current while maintaining good thermal energy dissipation characteristics.

The present invention provides an electronic switch module in which there is an interlocking base plate. The base plate includes a first electrically conductive element and a second electrically conductive element arranged to interlock with but not physically contact the first electrically conductive element. The first electrically conductive element and the second electrically conductive element are arranged in a planar relationship with respect to each other. A housing defines an inner volume and is comprised of an insulating material, the housing being formed to affix the first electrically conductive element and the second electrically conductive element in the planar arrangement. At least one semiconductor die has a first side mounted to and in electrical contact with one of the first and second electrically conductive elements and a second side electrically coupled to the other of the first and second electrically conductive elements.

According to another aspect of the invention the first and second electrically conductive elements each include nibs arranged on at least a part of a periphery of the first and second electrically conductive elements.

As still yet another aspect of the invention, the nibs are molded within the insulating material.

Another aspect of the invention provides nibs extending upward and outward from at least one of the first and second electrically conductive elements.

As still another aspect of the invention, the first and second electrically conductive elements each include a first side and a second side opposite the first side, at least a part of the first side of the first electrically conductive element and at least a part of the first side of the second electrically conductive element is wider than their respective second sides.

According to another aspect of the invention, the nibs are symmetrical around a plane centrally positioned between the first side and the second side of each of the first and second electrically conductive elements.

According to still yet another aspect of the invention, the thickness of the nibs is less than the thickness of the first and second electrically conductive elements.

As still another aspect of the invention, the nibs along respective interlocking portions form an approximately contiguous piece longitudinally along the at least a part of the periphery of the first and second electrically conductive elements.

The invention also provides another aspect in which the nibs are approximately contiguous along the periphery of the interlocking portion of both of the first and second electrically conductive elements.

The invention also provides an aspect in which the semiconductor devices are field effect transistors.

Still another aspect of the present invention includes a printed circuit board in which the printed circuit board is positioned within the inner volume of the housing and is in electrical contact with the at least one semiconductor die.

As still another aspect, the module is incorporated within an internal combustion engine.

As still yet another aspect, the field effect transistors are implemented on size four dice and the module is arranged to switch an electric current in excess of one thousand amperes.

As still another aspect of the present invention, a plurality of modules are electrically interconnected to create a switch interconnected to create a large-scale three phase inverter structure.

The present invention also provides an electronic switch module for use in an internal combustion engine in which there is an interlocking base plate which includes an electrically conductive plug element and an electrically conductive receptacle element arranged to interlock with but not physically contact the electrically conductive plug element. The electrically conductive plug element and the electrically conductive receptacle element are arranged in a planar relationship with respect to each other. A housing defines an inner volume and is comprised of an insulating material, the housing being formed to affix the electrically conductive plug element and the electrically conductive receptacle element in the planar arrangement. At least one semiconductor die has a first side which is mounted to and is in electrical contact with one of the electrically conductive plug and receptacle elements and has a second side electrically coupled to the other of the electrically conductive plug and receptacle elements.

As another aspect of the invention, the electrically conductive plug element is formed in the shape of a "T" and the electrically conductive receptacle element is formed in the shape of a "U".

As still another aspect of the invention, the at least one field effect transistor is mounted to the electrically conductive plug element.

As still yet another aspect of the invention, the at least one field effect transistor is mounted to the electrically conductive receptacle element.

According to another aspect of the present invention, the module further includes a printed circuit board which is:

positioned within the inner volume of the housing;

in electrical contact with the at least one semiconductor die; and mounted to the electrically conductive plug element.

Other features and advantages of the present invention will become apparent from the following description of the invention which refers to the accompanying drawings.

BRIEF DESCRIPTION OF THE DRAWINGS

For the purpose of illustrating the invention, there is shown in the drawings several forms which are presently preferred, it being understood, however, that the invention is not limited to the precise arrangements and instrumentalities shown.

DETAILED DESCRIPTION OF THE INVENTION

Figure 1:
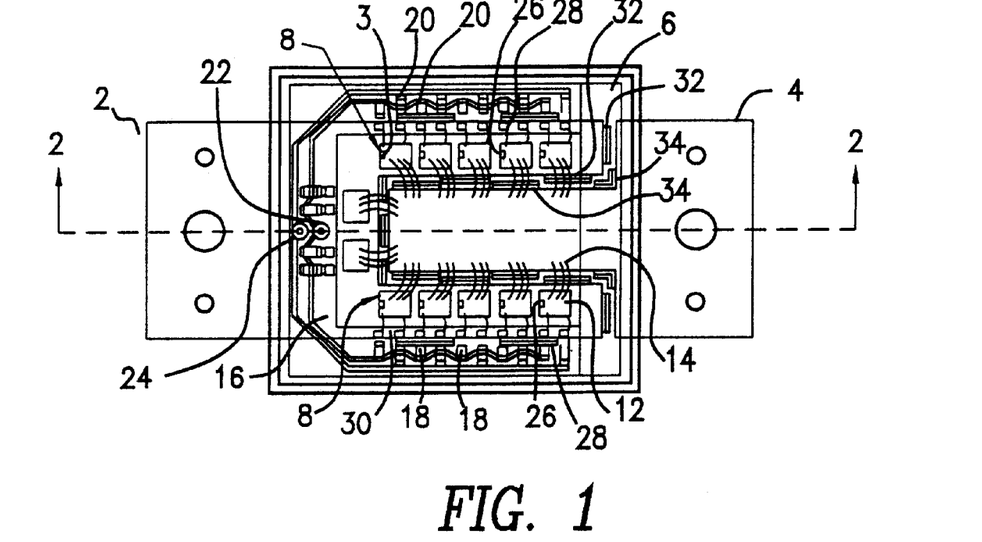
FIG. 1 is a top view of the first embodiment of a switch module of the present invention.
Figure 2:
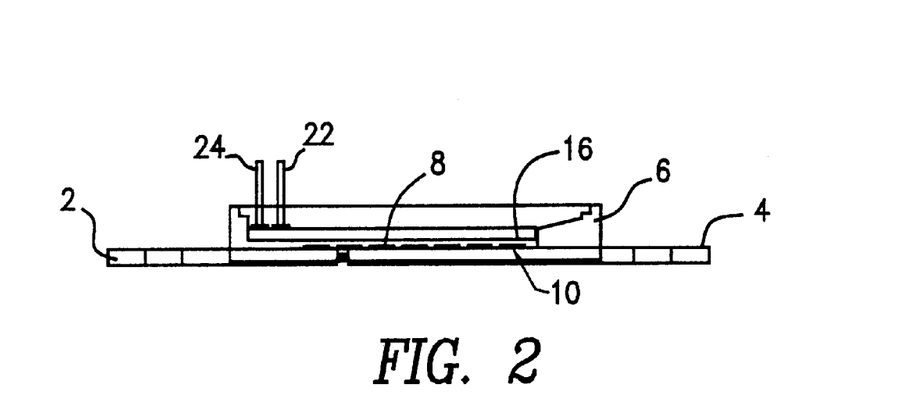
FIG. 2 is a section view of the first embodiment of the switch module shown in FIG. 1 taken through section 2—2.

With reference to the Figures wherein like numerals indicate like elements, FIGS. 1 and 2 show a top view and a section view, respectively, of the switch module of the present invention. The switch module is compact and sturdy enough to be used in automotive applications, such as a switch component in the electronic control circuit for an internal combustion engine turbocharger, supercharger or super-turbocharger. The lower portion of the module is formed by a two piece interlocking base plate formed by a conductive "U-shaped" receptacle 2 and a conductive "T-shaped" plug 4. The pieces are formed such that the plug 4 fits into the notch opening in receptacle 2. The receptacle 2 and plug 4 are preferably metal. A one piece molded insulating housing 6 is formed to secure the receptacle 2 and plug 4 together and to provide an inner volume in which to locate additional module components. The insulating material used to form the housing 6 is preferably made of a thermally conductive non-electrically conductive ceramic material. The housing 6 can be formed by molding or machining the insulating material, or a combination thereof. A cover (not shown) can optionally be affixed to the top of the housing 6. Also, the interior of the housing can be filled with an insulating gel or potting substance once the module components have been assembled. As is known in the art, the use of a potting material improves heat dissipation and reduces module failure resulting from mechanical vibration.

Mounted to the receptacle 2 on the portion which is located inside the housing 6 are a number of FETs 8. The FETs 8 are typically MOSFET bare die that are epoxied or soldered to the conductive receptacle 2. For example, as shown in FIG. 1, 12 FETs 8 are arranged around receptacle 2 forming the shape of a horseshoe. It should be noted that not all of the FETs 8 are required for current switching, and one or more FETs may be of a type used for current sensing.

The arrangement of the FETs 8 in this manner results in an even distribution of heat across the entire base of the module. Although the plug 4 does not have any semiconductor devices, it is thermally coupled to the receptacle 2 through the housing 6, thereby providing additional surface area from which to dissipate thermal energy. In addition, heat sinks can be attached to the base area if desired for a particular application.

The FETs 8 are attached and connected as follows. The drains 10 (see FIG. 2) at the bottom of FETs are bonded to the receptacle 2 forming an electrical contact between them. The source region 12 of each FET 8 is electrically connected to the plug 4 by one or more source wire bonds 14. Of course, as an alternative embodiment, the source region can be wire bonded to the receptacle 2 and the drains can be bonded to the plug 4. Positioned above the receptacle 2 and the plug 4 in housing 6 is a printed circuit board 16.

The printed circuit board 16 has a pattern formed on it which provides a path from the gate contact pads 18 and the source sense contact pads 20 to gate contact pin 22 and source sense contact pin 24, respectively. The use of a gate contact pin 22 and a source sense contact pin 24 provides a convenient way to provide the gate to source voltage required to switch the FETs 8.

The gate region 26 of each FET 8 is electrically connected to its respective gate contact pad 18 by a gate wire bond 28.

The source region 12 of each FET 8 is additionally electrically connected to its respective source sense contact pad 20 by source sense wire bond 30.

As is described below in detail, the receptacle 2 and plug 4 each respectively contain a series of receptacle NIBs 32 and plug NIBs 34. The NIBs are arranged along the periphery of the receptacle 2 and the plug 4 on the portions of those components upon which housing 6 will be molded. The arrangement of the receptacle NIBs 32 and plug NIBs 34 are such that when the module is molded, the NIBs provide added stability and strength to the module by providing additional surface area around which a mold can be formed. As shown in FIG. 1, the receptacle NIBs 32 and plug NIBs 34 are arranged in a discontinuous manner such that the receptacle NIBs 32 and the plug NIBs 34 located on the interlocking surfaces of the receptacle 2 and plug 4 form an approximately contiguous NIB region without requiring that the receptacle 2 and plug 4 be in physical contact with each other. Areas on the outer surfaces of the receptacle 2 and plug 4 to be molded with the housing 6 also have NIB areas. As is discussed below, the receptacle NIBs 32 and plug NIBs 34 can each be respectively formed as an approximately contiguous piece longitudinally along each side of the receptacle 2 and plug 4 which will be molded to the housing 6.

Figure 3:
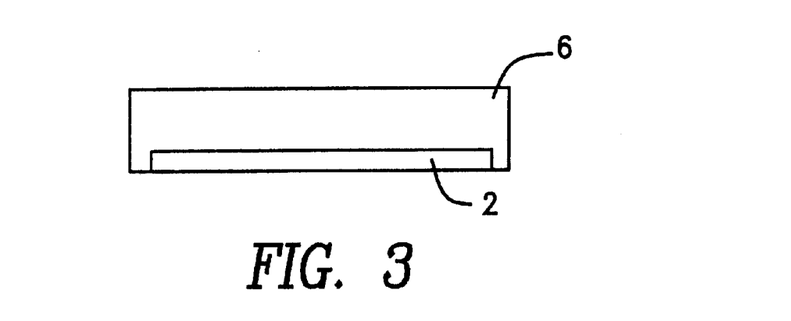
FIG. 3 is an end view of the switch module of the first embodiment of the present invention.

FIG. 3 shows an end view of the module. It should be noted that the housing 6 is formed such that a portion overlaps the receptacle 2 and plug 4 to form a planar region along the bottom of the switch module.

Figure 4:
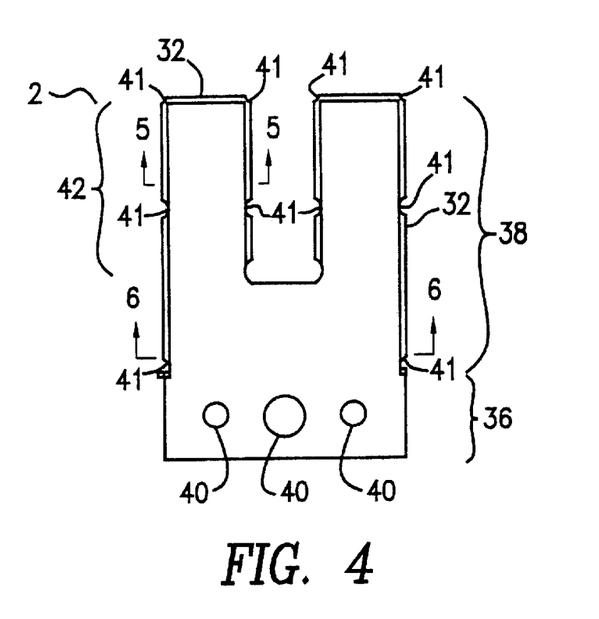
FIG. 4 is a top view of the receptacle for the switch module shown in FIGS. 1–3.

FIG. 4 shows a top view of the receptacle 2 for the module shown in FIGS. 1–3. It should be noted, however, that the receptacle 2 shown in this figure has an alternate embodiment of receptacle NIBs 32. As shown in FIG. 4, receptacle NIBs 32 are almost contiguous along each side which will be molded to form the housing 6. The receptacle 2 is formed as a single metallic structure in which there is a drain mounting area 36 and a receptacle housing area 38. The drain mounting area 36 is external of the housing 6, and the receptacle housing area 38 is molded within housing 6 and is also the portion of the receptacle 2 upon which the FETs 8 are mounted. The drain mounting area 36 is fitted with one or more receptacle mounting holes 40 for making external drain connections and affixing the module as needed. The nibbed portions of the plug 2 are fitted with a series of notches 41.

Figure 5:
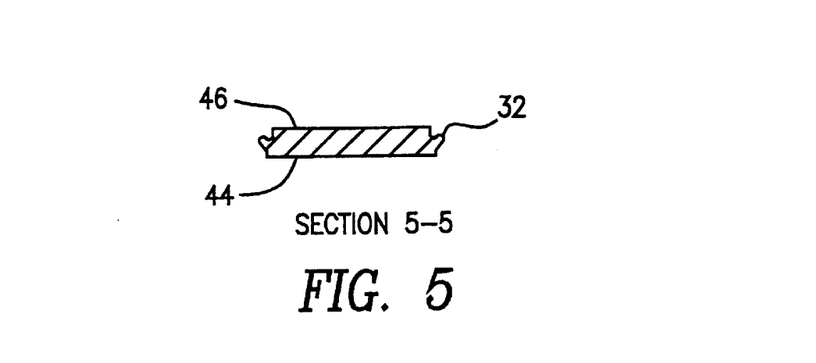
FIG. 5 is a section view of the receptacle shown in FIG. 4 taken through section 5—5.

FIG. 5 is a section view of the receptacle 2 shown in FIG. 4 taken through section 5—5. As shown in FIG. 5, each finger region 42 is arranged such that the receptacle bottom 44 of the finger region 42 is slightly wider than the receptacle top 46. The receptacle NIBs 32 are formed such that they extend upward and outward from the sides of the receptacle 2.

Figure 6:
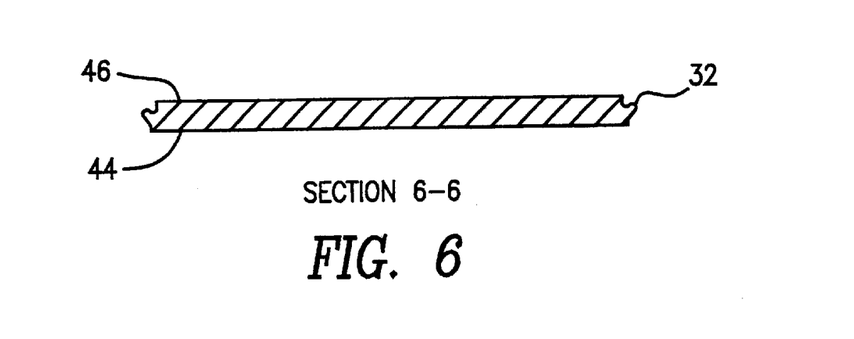
FIG. 6 is a section view of the receptacle shown in FIG. 4 taken through section 6—6.
Figure 7:
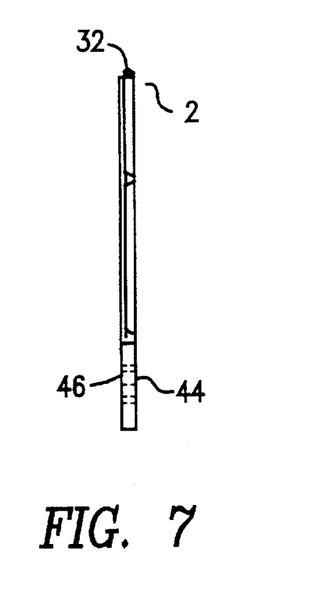
FIG. 7 is a side view of the receptacle shown in FIG. 4.

FIG. 6 is a section view of the receptacle 2 shown in FIG. 4 taken through section 6—6. As shown in FIG. 6, the receptacle 2 is arranged similarly to the finger region 42 such that the receptacle bottom 44 is wider than the receptacle top 46, and the receptacle NIBs 32 extend upward and outward from the receptacle 2. It should be understood, however, that the width of receptacle bottom 44 can be equal to or smaller than the width of receptacle top 46. FIG. 7 shows a side view of the receptacle 2.

Figure 8:
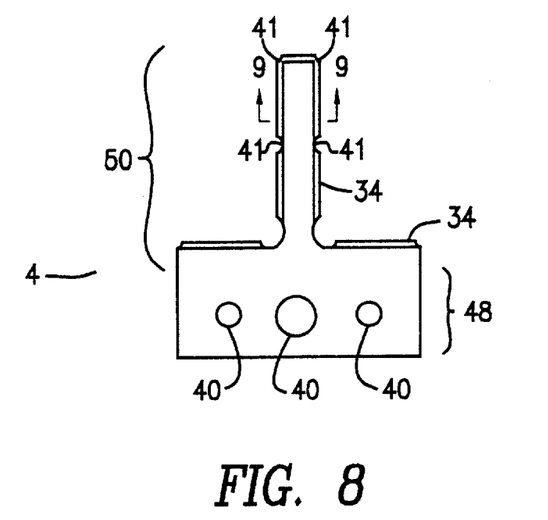
FIG. 8 is a top view of the plug for the switch module shown in FIGS. 1–3.

FIG. 8 is a top view of the plug 4 of the module shown in FIGS. 1–3. As shown in FIG. 8, the plug 4 is a metallic plate in which there is a source mounting area 48 and a key region 50. The source mounting area 48 is formed external to the housing 6, and provides one or more mounting holes 40 that provide a way to make the external source connections and affix the module to another object. The key region 50 is formed within the housing 6 and provides a convenient spot to attach the source regions 12 of FETs 8 by source wire bonds 14.

Figure 9:
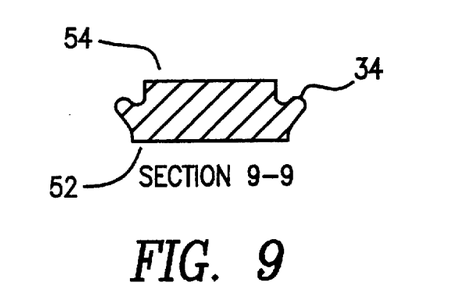
FIG. 9 is a section view of the plug shown in FIG. 8 taken through section 9—9.
Figure 10:
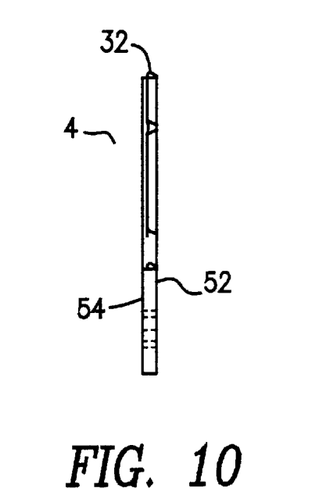
FIG. 10 is a side view of the plug shown in FIG. 8.

FIG. 9 shows a sectional view of the key region 50 of the plug 4 taken through section 9-9. The key region 50 is formed such that the plug bottom 52 is wider than the plug top 54. The plug NIBs 34 are formed along the sides of the plug 4 such that they extend upward and outward from the plug bottom 52. The width of the plug bottom 52 can be equal to or less than the width of the plug top 54. FIG. 10 is a side view of the plug 4 shown in FIG. 8. Using appropriate FETs 8, a switch module can be prepared that can switch currents in excess of 1,000 Amps.

Figure 11:
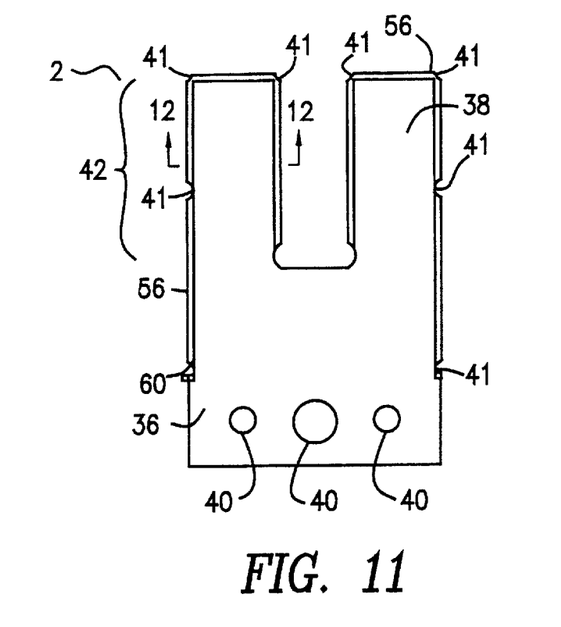
FIG. 11 is a top view of a receptacle of the second embodiment of the present invention.
Figure 12:
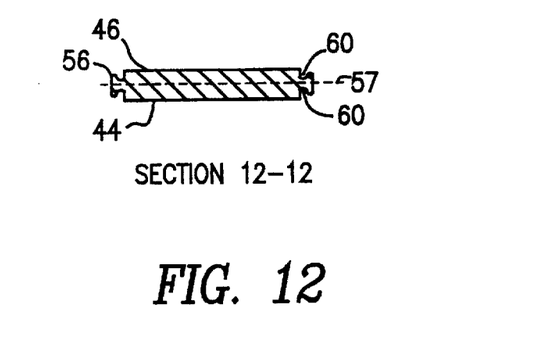
FIG. 12 is a section view of the receptacle shown in FIG. 11 taken through section 12—12.
Figure 13:
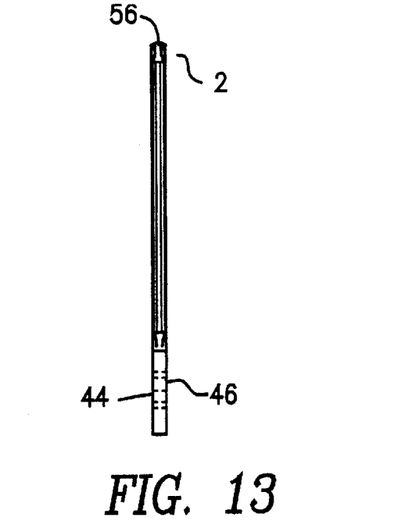
FIG. 13 is a side view of the receptacle shown in FIG. 11.
Figure 14:
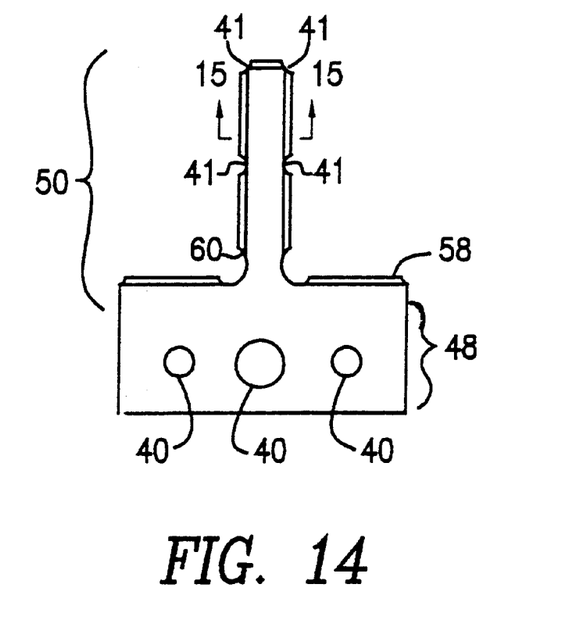
FIG. 14 is a top view of a plug of the second embodiment of the present invention.
Figure 15:
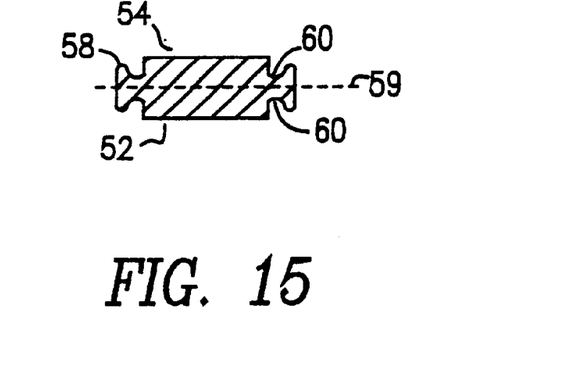
FIG. 15 is a section view of the plug shown in FIG. 14 taken through section 15—15.
Figure 16:
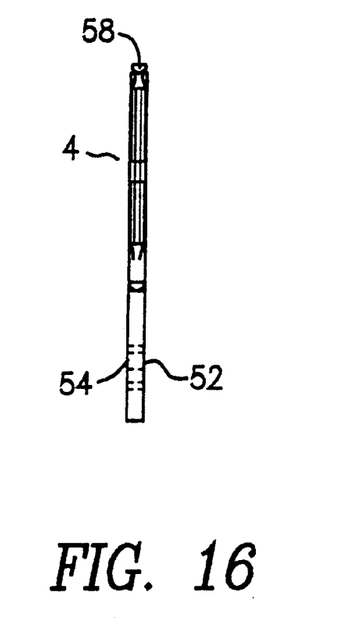
FIG. 16 is a side view of the receptacle shown in FIG. 14.

FIGS. 11–16 show a second embodiment of the present invention in which FIGS. 11–13 are a top view, section view of FIG. 11 taken through section 12—12, and side view, respectively, of an alternate receptacle 2, and FIGS. 14–16 are a top view, section view of FIG. 14 taken through section 15—15 and side view, respectively, of an alternate plug 4. For the sake of clarity, only those portions of the second embodiment which differ from those of the first embodiment will be described. As shown in FIGS. 11–16, the receptacle NIBs 32 and plug NIBs 34 of the first embodiment are replaced by symmetrical receptacle NIBs 56 and symmetrical plug NIBs 58, respectively. As shown in detail in FIGS. 12 and 15, the symmetrical receptacle NIBs 56 and symmetrical plug NIBs 58 extend outward from the receptacle 2 and plug 4, respectively, such that the top of the NIBs and the bottom of the NIBs are symmetrical around planes 57 and 59, centrally positioned between the bottom and top of the receptacle 2 and plug 4. The NIBs of the second embodiment are shaped such that the outer sides of the NIB are parallel with the sides of the receptacle 2 and plug 4, and their height (thickness) is less than the height (thickness) of the receptacle 2 and the plug 4. Ridges 60 are located between the main body of the receptacle 2 and plug 4 and the outer portions of the symmetrical receptacle NIBs 56 and symmetrical plug NIBs 58, respectively, and longitudinally positioned along the sides of the receptacle 2 and plug 4.

Figure 17:
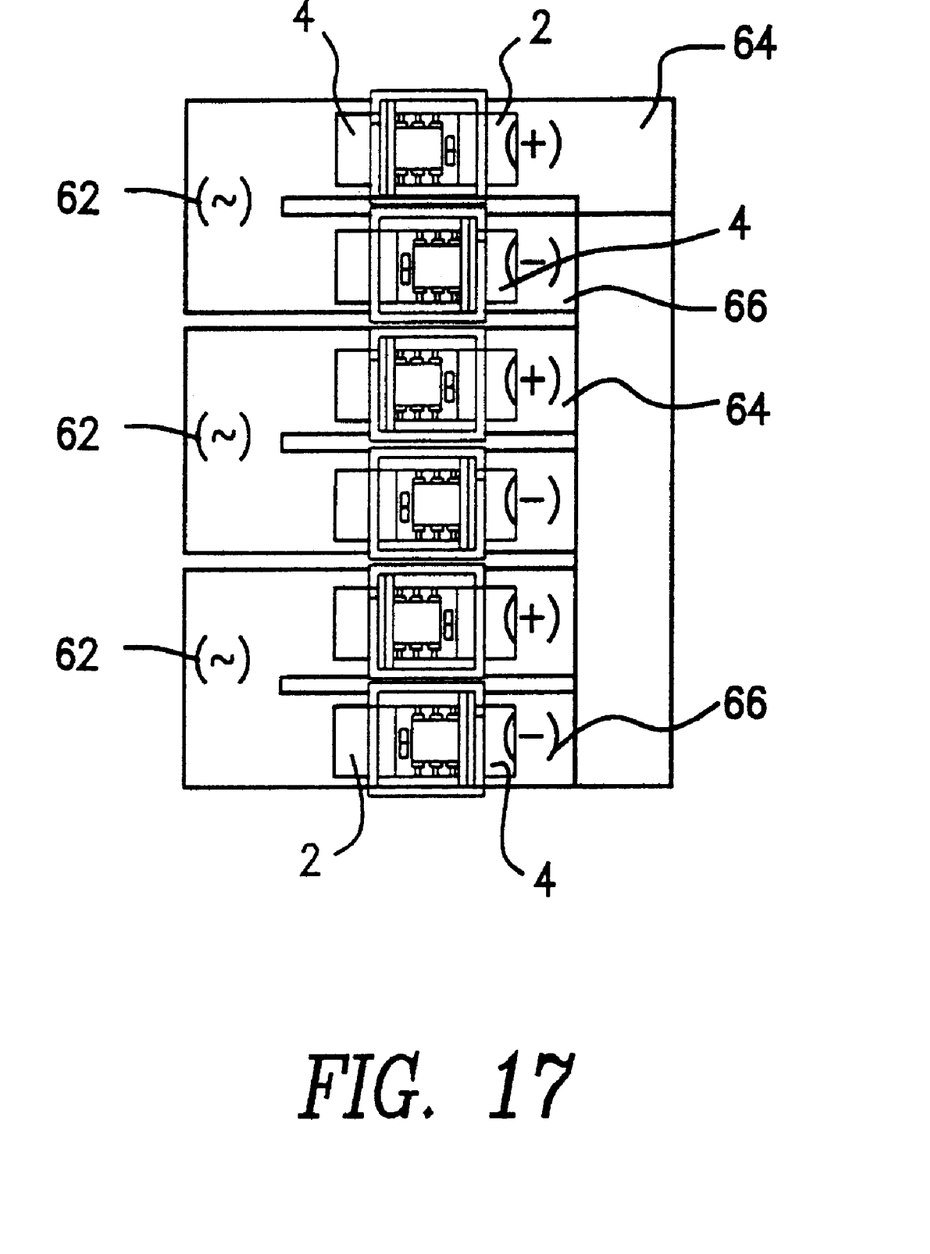
FIG. 17 shows an arrangement of a plurality of switch modules using plugs and receptacles of the first and second embodiments to create a large-scale three phase inverter structure.

FIG. 17 shows an arrangement of a plurality of switch modules of the first and second embodiments to create a large-scale three phase switch structure. As shown in FIG. 17, the switch modules are arranged such that the alternating plugs 4 and receptacles 2 are electrically connected to a metallic common connector 62. Similarly, and in alternating fashion, the receptacles 2 and plugs 4 are electrically connected to positive connectors 64 and negative connectors 66, respectively, such that a receptacle 2 is electrically connected to a positive connector 64, and a plug 4 is electrically connected to a negative connector 66. A number of switch modules may be connected in series via a connecting member (not shown).

The invention as described herein provides an electronic single switch module having the advantages of being compact, rugged and able to switch very high current loads while simultaneously providing excellent thermal management characteristics. Using appropriate FETs, for example, size "4", the module can switch currents in excess of 1,000 Amps. These capabilities are particularly well suited for use in automotive engine applications where switching large currents is often required. The invention is flexible enough that the current handling capacity and cost can be tailored to a particular application by adjusting the number of FETs 8 housed within the switch module.

Further, with all of the aforementioned embodiments, the arrangement of the source connection point and the drain connection point are such that a plurality of single switch modules can be easily interconnected serially or in parallel to tailor the module to a particular application.

Although the present invention has been described in relation to particular embodiments thereof, many other variations and modifications and other uses will become apparent to those skilled in the art. It is preferred, therefore, that the scope of the present invention be measured not by the specific disclosure herein, but only by the appended claims.

What is claimed is:

1. An electronic switch module, comprising:
    an interlocking base plate, the base plate including:
        a first electrically conductive element; and
        a second electrically conductive element arranged in an interlocking position with respect to the first electrically conductive element but not making physical contact with the same;
        the first electrically conductive element and the second electrically conductive element arranged in a planar relationship with respect to each other;
    a housing, the housing defining an inner volume and being comprised of an insulating material, the housing being formed to affix the first electrically conductive element and the second electrically conductive clement in the planar arrangement so that the first electrically conductive element and the second electrically conductive element interlock through the housing without making physical contact;
    at least one semiconductor die, the at least one semiconductor die having:
        a first side mounted to and in electrical contact with one of the first and second electrically conductive elements; and
        a second side electrically coupled to the other of the first and second electrically conductive elements.

2. The module according to claim 1, wherein the at least one semiconductor device in a field effect transistor.

3. The module according to claim 2, wherein the field effect transistors are implemented on size four dice and the module is arranged to switch an electric current in excess of one thousand amperes.

4. An electronic switch module, comprising:
    an interlocking base plate, the base plate including:
        a first electrically conductive element; and
        a second electrically conductive element arranged in an interlocking position with respect to the first electrically conductive element but not making physical contact with the same;
        the first electrically conductive element and the second electrically conductive element arranged in a planar relationship with respect to each other;
    a housing, the housing, defining an inner volume and being comprised of an insulating material, the housing being formed to affix the first electrically conductive element and the second electrically conductive element in the planar arrangement so that the first electrically conductive element and the second electrically conductive element interlock through the housing without making physical contact;
    at least one semiconductor die, the at least one semiconductor die having:
        a first side mounted to and in electrical contact with one of the first and second electrically conductive elements; and
        a second side electrically coupled to the other of the first and second electrically conductive elements;
    wherein the first and second electrically conductive elements each include nibs arranged on at least a part of a periphery of the first and second electrically conductive elements.

5. The module according to claim 4, wherein the nibs are molded within the insulating material.

6. The module according to claim 5, wherein the nibs extend upward and outward from at least one of the first and second electrically conductive elements.

7. The module according to claim 6, wherein the first and second electrically conductive elements each include a first side and a second side opposite the first side, at least a part of the first side of the first electrically conductive element and at least a part of the first side of the second electrically conductive element being wider than their respective second sides.

8. The module according to claim 5, wherein the nibs are symmetrical around a plane centrally positioned between the first side and the second side of each of the first and second electrically conductive elements.

9. The module according to claim 8, wherein a thickness of the nibs is less than a thickness of the first and second electrically conductive elements.

10. The module according to claim 5, wherein the nibs along respective interlocking portions form an approximately contiguous piece longitudinally along the at least a part of the periphery of the first and second electrically conductive elements.

11. The module according to claim 5, wherein the nibs are approximately contiguous along the periphery of the interlocking portion of both of the first and second electrically conductive elements.

12. The module according to claim 11, wherein the nibs extend upward and outward from at least one of the first and second electrically conductive elements.

13. The module according to claim 11, wherein the nibs are symmetrical around a plane centrally positioned between the first side and the second side of each of the first and second electrically conductive elements.

14. The module according to claim 4, further comprising a printed circuit board, the printed circuit board being positioned within the inner volume of the housing and being in electrical contact with the at least one semiconductor die.

15. The module according to claim 4, wherein the module is incorporated within an internal combustion engine.

16. The module according to claim 4, wherein a plurality of modules are electrically interconnected to create a switch interconnected to create a large-scale three phase inverter structure.

17. An electronic switch module for use in an internal combustion engine, comprising:
    an interlocking base plate, the base plate including:
        an electrically conductive plug element; and
        an electrically conductive receptacle element arranged in an interlocking position with respect to the electrically conductive plug element but not making physical contact with the same;
        the electrically conductive plug clement and the electrically conductive receptacle element arranged in a planar relationship with respect to each other;
    a housing, the housing defining an inner volume and being comprised of an insulating material, the housing being formed to affix the electrically conductive plug element and the electrically conductive receptacle element in the planar arrangement so that the electrically conductive plug element and the electrically conductive receptacle element interlock through the housing without making physical contact;

at least one semiconductor die, the at least one semiconductor die having:
- a first side mounted to and in electrical contact with one of the electrically conductive plug and receptacle elements; and
- a second side electrically coupled to the other of the electrically conductive plug and receptacle elements.

18. The module according to claim 17, wherein the at least one semiconductor is a field effect transistor.

19. An electronic switch module for use in an internal combustion engine, comprising:
- an interlocking base plate, the base plate including:
  - an electrically conductive plug element; and
  - an electrically conductive receptacle element arranged in an interlocking position with respect to the electrically conductive plug element without making physical contact with the same;
  - the electrically conductive plug element and the electrically conductive receptacle element arranged in a planar relationship with respect to each other;
- a housing, the housing defining an inner volume and being comprised of an insulating material, the housing being formed to affix the electrically conductive plug element and the electrically conductive receptacle element in the planar arrangement so that the electrically conductive plug element and the electrically conductive receptacle element interlock through the housing without making physical contact;
- at least one semiconductor die, the at least one semiconductor die having:
  - a first side mounted to and in electrical contact with one of the electrically conductive plug and receptacle elements; and
  - a second side electrically coupled to the other of the electrically conductive plug and receptacle elements;

wherein the at least one semiconductor is a field effect transistor, and the electrically conductive plug element is formed in the shape of a "T" and the electrically conductive receptacle element is formed in the shape of a "U".

20. The module according to claim 19, wherein the at least one field effect transistor is mounted to the electrically conductive plug element.

21. The module according to claim 20, further comprising a printed circuit board, the printed circuit board being:
- positioned within the inner volume of the housing;
- in electrical contact with the at least one semiconductor die; and
- mounted to the electrically conductive plug element.

22. The module according to claim 19, wherein the at least one field effect transistor is mounted to the electrically conductive receptacle element.

23. The module according to claim 19, wherein the electrically conductive plug and receptacle elements each include nibs arranged on at least a part of a periphery of the electrically conductive plug and receptacle elements, and wherein the nibs are molded within the insulating material.

24. The module according to claim 23, wherein the nibs extend upward and outward from at least one of the electrically conductive plug and receptacle elements.

25. The module according to claim 23, wherein each of the electrically conductive plug and receptacle elements include a first side and a second side opposite the first side, and wherein the nibs are symmetrical around a plane centrally positioned between the first side and the second side of each of the electrically conductive plug and receptacle elements.

* * * * *